(12) United States Patent
Sasaki

(10) Patent No.: US 10,856,435 B2
(45) Date of Patent: Dec. 1, 2020

(54) FAN ATTACHMENT STRUCTURE AND FAN

(71) Applicant: FANUC CORPORATION, Yamanashi (JP)

(72) Inventor: Kazuyuki Sasaki, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/789,144

(22) Filed: Oct. 20, 2017

(65) Prior Publication Data
US 2018/0124948 A1 May 3, 2018

(30) Foreign Application Priority Data
Oct. 27, 2016 (JP) .................................. 2016-210136

(51) Int. Cl.
*H05K 7/20* (2006.01)
*F04D 25/06* (2006.01)
(Continued)

(52) U.S. Cl.
CPC ..... *H05K 7/20172* (2013.01); *F04D 25/0606* (2013.01); *F04D 29/522* (2013.01);
(Continued)

(58) Field of Classification Search
CPC ....... G06F 1/181–182; H05K 7/20218–20381; H05K 7/20409–20418; H05K 7/20009–202; H05K 7/20172; H05K 5/0247; H01L 23/367–3677; H01L 23/473; H01L 23/46–467; F04D 25/0606;
(Continued)

(56) References Cited

U.S. PATENT DOCUMENTS 4,457,672 A * 7/1984 Ogura .................... F04D 25/10
248/27.1
5,514,036 A 5/1996 Lin
(Continued)

FOREIGN PATENT DOCUMENTS

CN 2437889 Y 7/2001
CN 2812519 Y 8/2006
(Continued)

OTHER PUBLICATIONS

English Abstract for Japanese Publication No. 2008-071881 A, published Mar. 27, 2008, 2 pgs.
(Continued)

*Primary Examiner* — Zachary Pape
(74) *Attorney, Agent, or Firm* — Fredrikson & Byron, P.A.

(57) ABSTRACT

A fan attachment structure for attaching a fan to a casing is provided. The casing includes an accommodation portion configured to accommodate the fan, and an engaged portion formed on a side surface of the accommodation portion. The fan includes an engagement portion formed in a housing, and configured to engage with the engaged portion to restrict movement of the fan in a direction from an interior of the accommodation portion to an opening portion, and a rattling suppressing mechanism formed on a surface of the housing facing toward the side surface of the accommodation portion and configured to bias the fan in a direction apart from the side surface of the accommodation portion.

9 Claims, 16 Drawing Sheets

(51) Int. Cl.
*F04D 29/60* (2006.01)
*F04D 29/64* (2006.01)
*F04D 29/52* (2006.01)
*F04D 29/32* (2006.01)
*H05K 5/02* (2006.01)

(52) U.S. Cl.
CPC ......... *F04D 29/601* (2013.01); *F04D 29/646* (2013.01); *F04D 25/06* (2013.01); *F04D 29/325* (2013.01); *H05K 5/0247* (2013.01)

(58) Field of Classification Search
CPC ...... F04D 25/06; F04D 29/522; F04D 29/601; F04D 29/646; F04D 29/325
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,592,327 B2* | 7/2003 | Chen | F04D 25/166 | 415/213.1 |
| 6,633,486 B2* | 10/2003 | Coles | H05K 7/1409 | 312/223.1 |
| 6,663,416 B2* | 12/2003 | Huang | H05K 7/20172 | 361/695 |
| 6,737,774 B1 | 5/2004 | Shin | | |
| 7,040,862 B2* | 5/2006 | Otsuka | F04D 29/542 | 29/888.02 |
| 7,156,611 B2* | 1/2007 | Oosawa | F04D 19/007 | 415/199.5 |
| 7,251,135 B2* | 7/2007 | Crippen | H05K 7/20172 | 165/104.33 |
| 7,527,085 B2* | 5/2009 | Iijima | F28D 1/05375 | 165/104.33 |
| 8,322,974 B2* | 12/2012 | Chen | F04D 29/668 | 415/119 |
| 8,322,998 B2* | 12/2012 | Hanaoka | F04D 29/542 | 415/213.1 |
| 8,323,002 B2* | 12/2012 | Zha | H01L 23/4006 | 361/697 |
| 8,475,126 B2* | 7/2013 | Yoshida | F04D 19/007 | 415/214.1 |
| 8,800,951 B2* | 8/2014 | Sun | G06F 1/20 | 248/200 |
| 8,944,402 B2* | 2/2015 | Sun | G06F 1/183 | 248/300 |
| 9,568,020 B2* | 2/2017 | Yasuda | F04D 17/162 | |
| 2003/0042004 A1* | 3/2003 | Novotny | F25D 19/00 | 165/80.2 |
| 2003/0099094 A1* | 5/2003 | Coles | H05K 7/1409 | 361/726 |
| 2005/0106008 A1* | 5/2005 | Park | F01D 5/10 | 415/119 |
| 2006/0254790 A1* | 11/2006 | Hata | F04D 29/582 | 174/16.3 |
| 2007/0053160 A1* | 3/2007 | Chen | G06F 1/20 | 361/695 |
| 2007/0062513 A1* | 3/2007 | Gagas | F24C 15/2021 | 126/299 D |
| 2007/0230138 A1* | 10/2007 | Otsuki | H01L 23/4006 | 361/719 |
| 2007/0252451 A1* | 11/2007 | Shibuya | F04D 25/068 | 310/64 |
| 2008/0035315 A1* | 2/2008 | Han | F04D 17/04 | 165/121 |
| 2008/0063542 A1* | 3/2008 | Oguma | F04D 25/0613 | 417/354 |
| 2008/0063548 A1 | 3/2008 | Fujioka | | |
| 2008/0101920 A1* | 5/2008 | Yoshida | F04D 25/0613 | 415/68 |
| 2008/0226446 A1* | 9/2008 | Fujieda | F04D 25/0613 | 415/203 |
| 2008/0260526 A1* | 10/2008 | Nishizawa | F04D 19/007 | 415/199.4 |
| 2008/0286135 A1* | 11/2008 | Yoshida | F04D 19/007 | 417/423.5 |
| 2010/0117468 A1* | 5/2010 | Kurita | F04D 19/002 | 310/71 |
| 2011/0063799 A1* | 3/2011 | Takahasi | F04D 25/08 | 361/695 |
| 2012/0255713 A1* | 10/2012 | Horng | F04D 17/04 | 165/121 |
| 2013/0004303 A1* | 1/2013 | Zhang | H05K 7/20172 | 415/182.1 |
| 2013/0084173 A1* | 4/2013 | Fukuda | F04D 17/16 | 415/203 |
| 2013/0256501 A1* | 10/2013 | He | H05K 7/20 | 248/674 |
| 2014/0294621 A1* | 10/2014 | Narita | F04D 25/0613 | 417/354 |
| 2015/0369257 A1* | 12/2015 | Fujii | H05K 7/20172 | 415/177 |
| 2016/0222983 A1 | 8/2016 | Shih et al. | | |
| 2016/0265543 A1* | 9/2016 | Fujita | F04D 29/4226 | |
| 2017/0042060 A1* | 2/2017 | Chen | H05K 7/20172 | |
| 2017/0096079 A1* | 4/2017 | Yokote | H01M 10/625 | |
| 2017/0114803 A1* | 4/2017 | Miwa | H05K 7/20172 | |
| 2017/0207689 A1* | 7/2017 | Suzuki | F04D 25/0613 | |
| 2017/0321707 A1* | 11/2017 | Takeshita | F04D 19/002 | |
| 2018/0058709 A1* | 3/2018 | Kagawa | F24F 7/013 | |
| 2018/0119709 A1* | 5/2018 | Morihara | F04D 29/403 | |

FOREIGN PATENT DOCUMENTS

| | | |
|---|---|---|
| CN | 101460041 A | 6/2009 |
| CN | 201386685 Y | 1/2010 |
| CN | 101650585 A | 2/2010 |
| CN | 201401371 Y | 2/2010 |
| CN | 105278649 A | 1/2016 |
| JP | 9266650 A | 10/1997 |
| JP | H09331176 A | 12/1997 |
| JP | 2002115693 A | 4/2002 |
| JP | 2004189203 A | 7/2004 |
| JP | 200871881 A | 3/2008 |

OTHER PUBLICATIONS

English Abstract for Japanese Publication No. 2004-189203 A, published Jul. 8, 2004, 2 pgs.
English Abstract and Machine Translation for Japanese Publication No. 09-266650 A, published Oct. 7, 1997, 7 pgs.
English Abstract and Machine Translation for Japanese Publication No. JPH09-331176A, published Dec. 22, 1997, 15 pgs.
English Abstract and Machine Translation for Chinese Publication No. CN2437889Y, published Jul. 4, 2001, 9 pgs.
English Abstract and Machine Translation for Japanese Publication No. JP2002-115693A, published Apr. 19, 2002, 6 pgs.
English Abstract and Machine Translation for Chinese Publication No. CN2812519Y, published Aug. 30, 2006, 11 pgs.
English Abstract and Machine Translation for Chinese Publication No. CN101460041A, published Jul. 17, 2009, 12 pgs.
English Abstract and Machine Translation for Chinese Publication No. CN201386685Y, published Jan. 20, 2010, 16 pgs.
English Abstract and Machine Translation for Chinese Publication No. CN201401371Y, published Feb. 10, 2010, 8 pgs.
English Abstract and Machine Translation for Chinese Publication No. CN101650585A, published Feb. 17, 2010, 11 pgs.
English Abstract and Machine Translation for Chinese Publication No. CN105278649A, published Jan. 27, 2016, 18 pgs.

* cited by examiner

FIG. 3
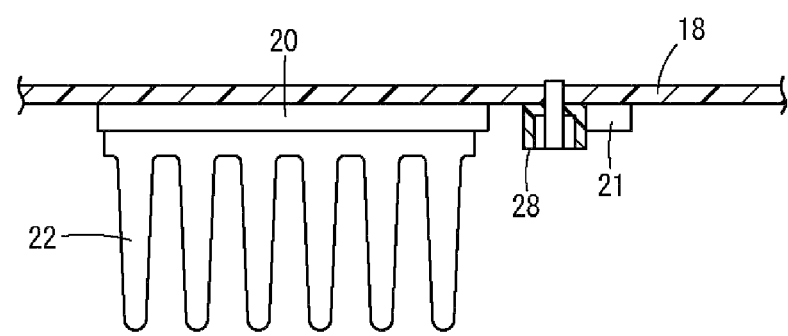
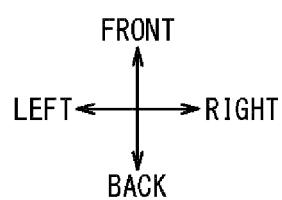

FIG. 4
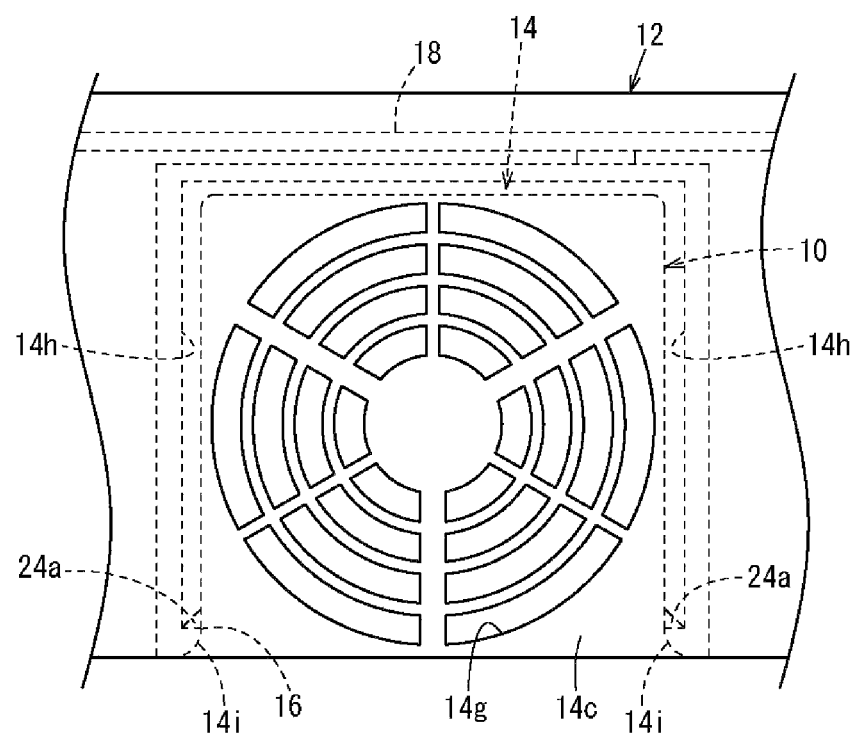
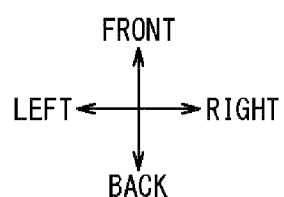

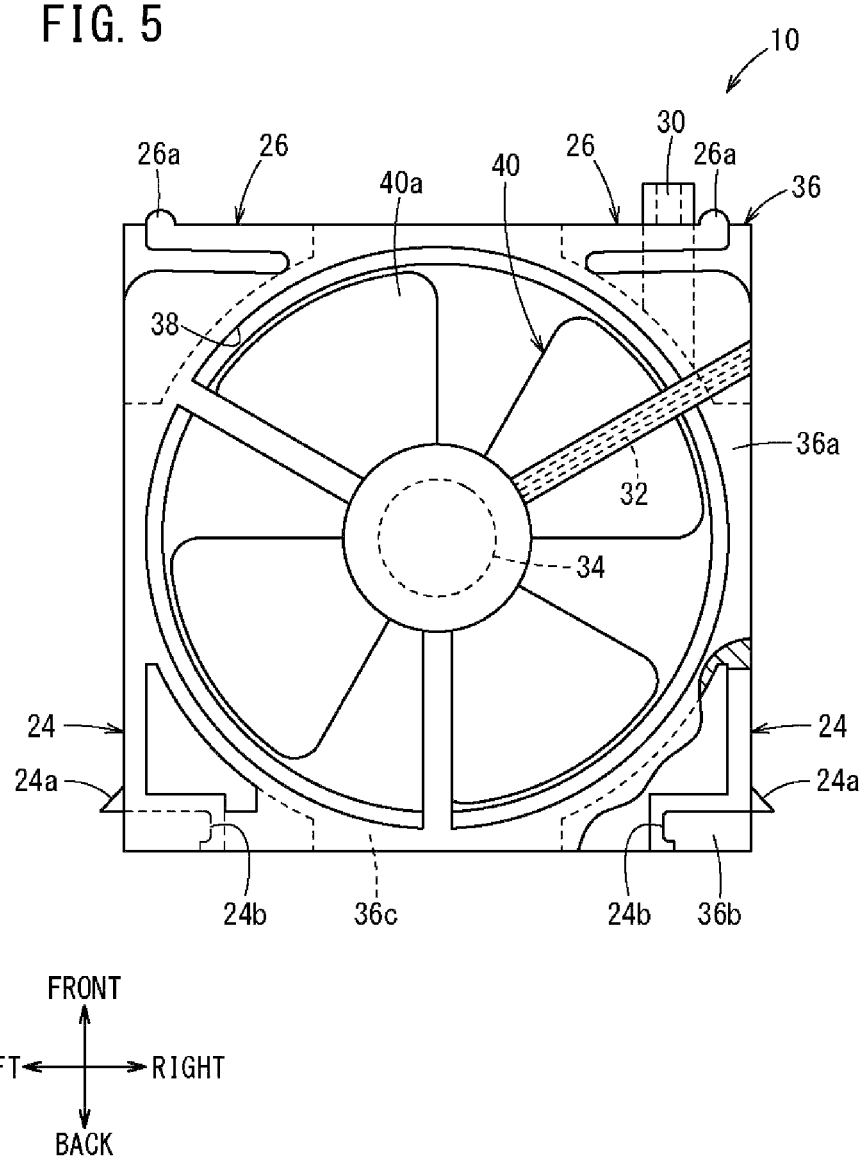

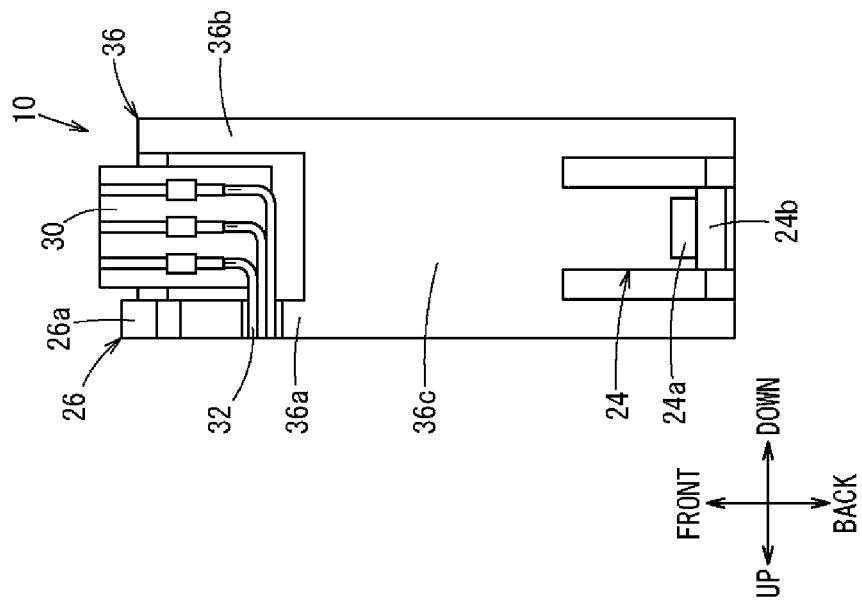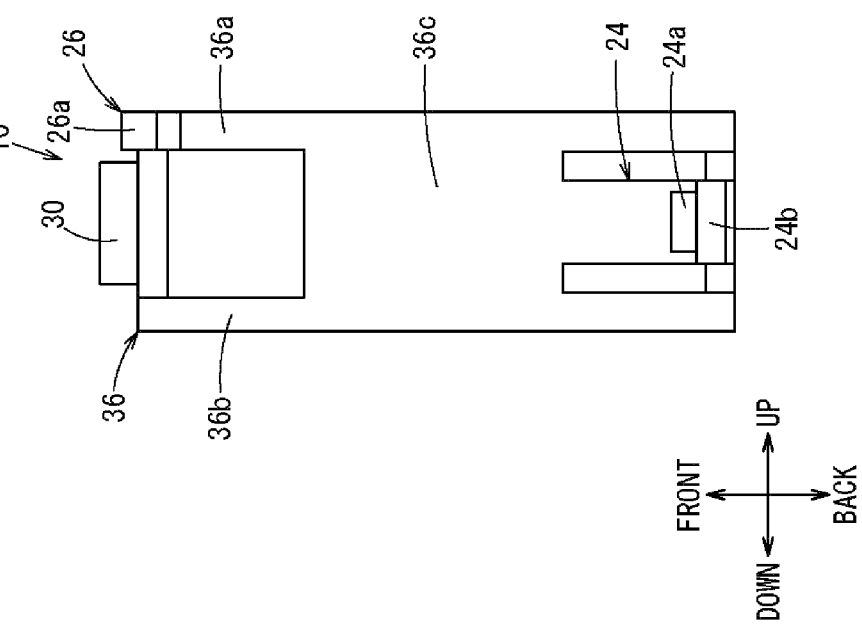

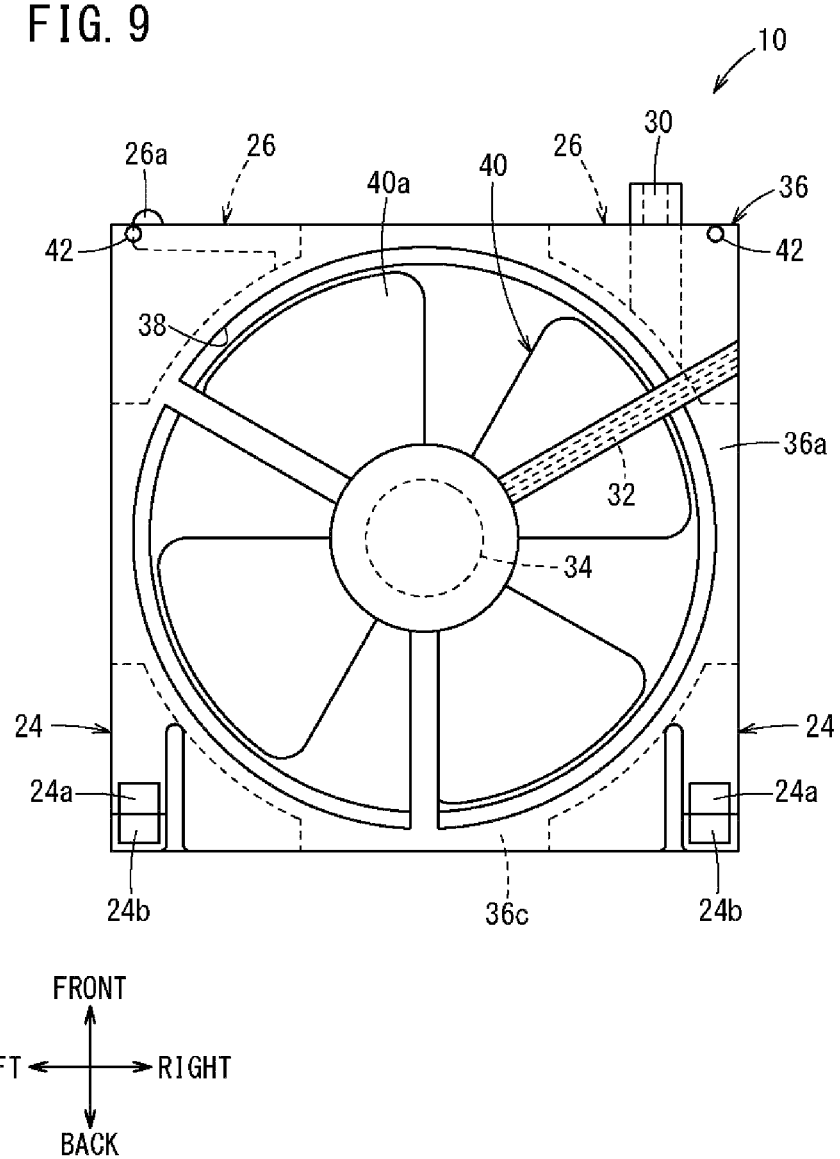

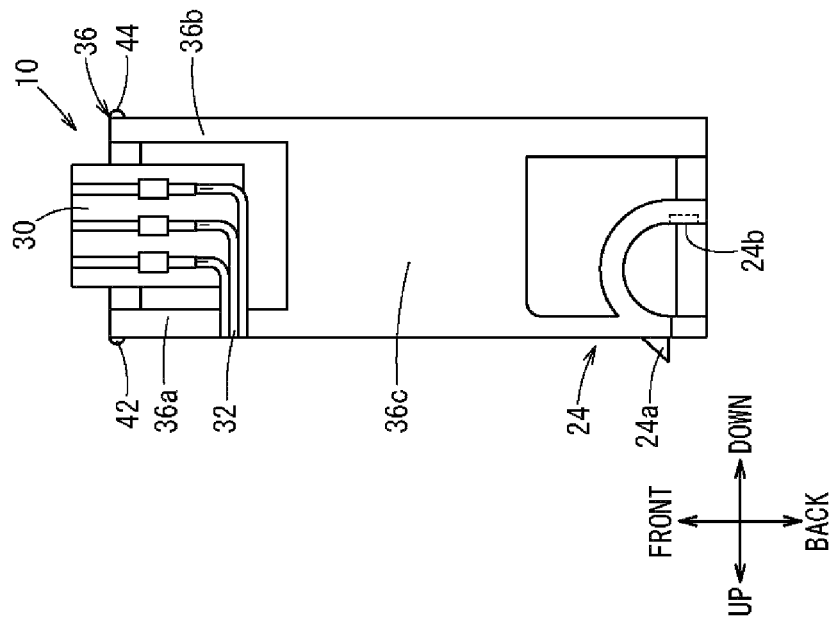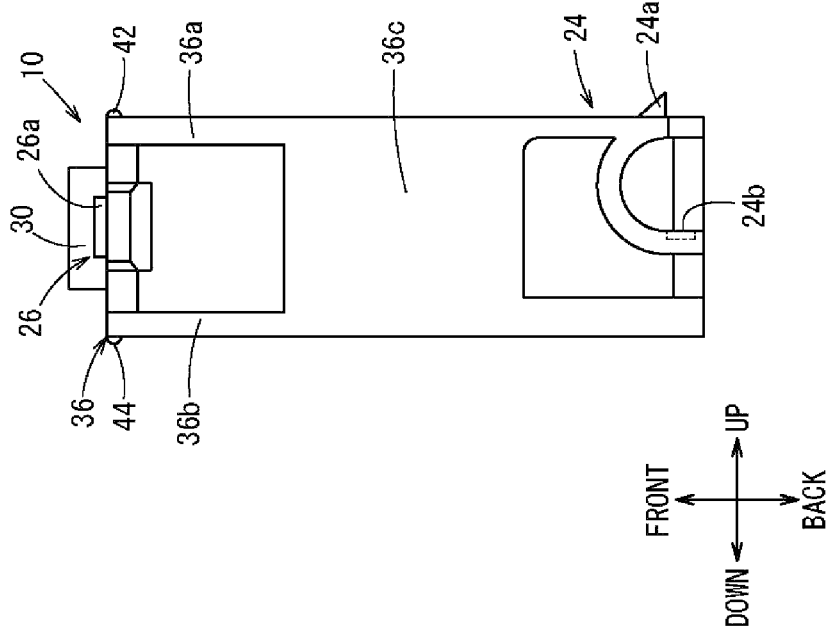

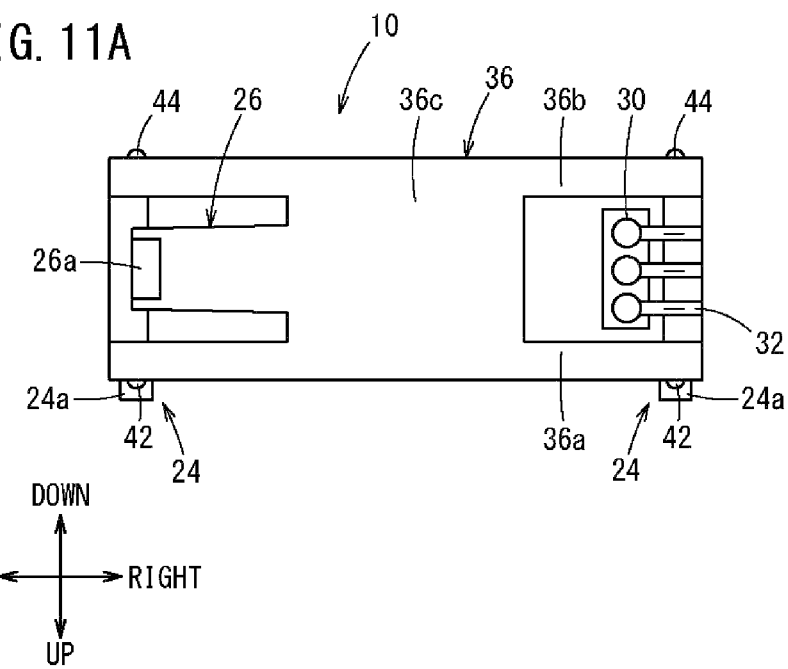
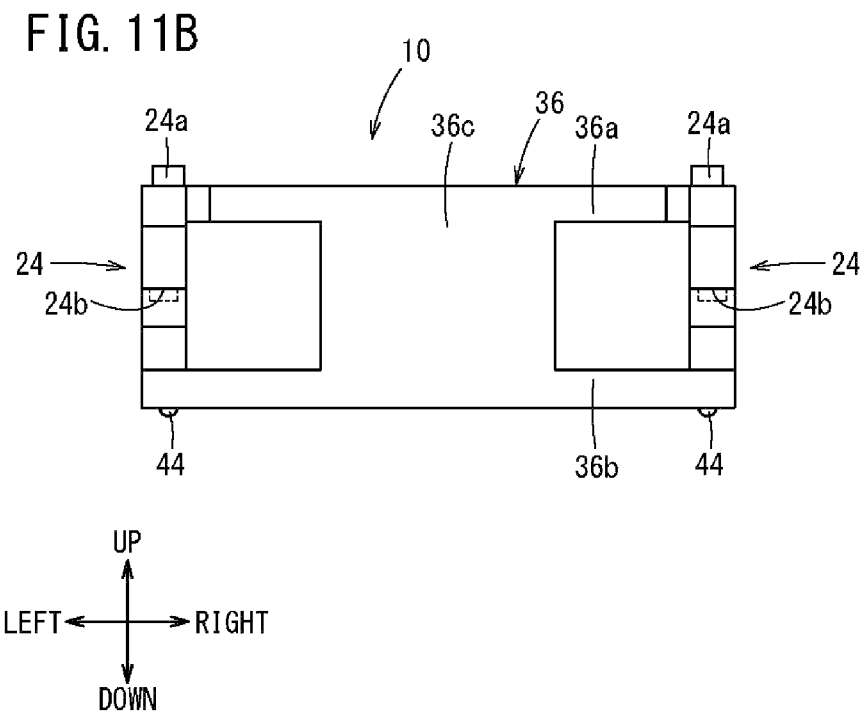

FAN ATTACHMENT STRUCTURE AND FAN

CROSS-REFERENCE TO RELATED APPLICATION

This application is based upon and claims the benefit of priority from Japanese Patent Application No. 2016-210136 filed on Oct. 27, 2016, the contents of which are incorporated herein by reference.

BACKGROUND OF THE INVENTION

Field of the Invention

The present invention relates to a fan attachment structure that attaches a fan for cooling electronic parts to a casing, and the fan.

Description of the Related Art

Japanese Laid-Open Patent Publication No. 2008-071881 discloses a structure in which latches are formed on side surfaces of a fan case, a flange of a fan motor is sandwiched between the latches and bent portions of a bottom surface of the fan case, and the fan motor is prevented from dropping from the fan case.

Japanese Laid-Open Patent Publication No. 09-266650 discloses a structure in which a metal holder is provided on an inner surface of an attachment chassis, and a cooling fan main body is fixed in the attachment chassis.

SUMMARY OF THE INVENTION

In a technique of Japanese Laid-Open Patent Publication No. 2008-071881, to attach a fan (fan motor) to a casing (fan case), it is necessary to form a gap between a side surface of the fan and a side surface of the casing, and it is concerned that the fan is rattled in the casing.

In a technique of Japanese Laid-Open Patent Publication No. 09-266650, the metal holder presses a fan (cooling fan main body) toward a contact terminal. Thus, the separate metal holder needs to be arranged in a casing (attachment chassis) and therefore there is a problem that the number of parts increases.

The present invention has been made to solve the above problem. An object of the present invention is to provide a fan and a fan attachment structure that can suppress an increase in the number of parts, and suppress rattling of a fan in a casing.

An aspect of the present invention is an attachment structure of a fan for attaching to a casing the fan configured to cool an electronic part accommodated in the casing, and the casing includes an accommodation portion including an opening portion in which the fan is inserted, and configured to accommodate the fan, and an engaged portion formed on a side surface of the accommodation portion, and the fan includes an impeller including a blade, a housing configured to rotatably support the impeller, an engagement portion formed in the housing, and configured to engage with the engaged portion to restrict movement of the fan in a direction from an interior of the accommodation portion toward the opening portion, and a biasing portion formed on a surface of the housing facing toward a side surface of the accommodation portion, and configured to bias the fan in a direction apart from the side surface of the accommodation portion. According to this configuration, it is possible to suppress an increase in the number of parts, and suppress rattling of the fan in the casing.

According to the aspect of the present invention, the fan may include a motor configured to drive the impeller, the casing may accommodate an electronic substrate on which the electronic part is mounted, and a supply side connector configured to supply power to the motor may be mounted on the electronic substrate, and the housing may include a load side connector configured to connect with the supply side connector. Consequently, when the fan is accommodated in the accommodation portion, the load side connector is connected with the supply side connector. Consequently, it is possible to improve efficiency of an operation of attaching the fan to the casing.

According to the aspect of the present invention, the biasing portion may be configured to bias the fan in a direction to move from the interior of the accommodation portion toward the opening portion. Consequently, it is possible to suppress rattling of the fan in the casing.

The aspect of the present invention may include an operation portion formed in the housing and configured to disengage the engaged portion and the engagement portion. Consequently, it is possible to easily detach the fan from the casing.

According to the aspect of the present invention, the operation portion may be formed extending outwardly from the opening portion of the accommodation portion. Consequently, the operator can easily operate the operation portion, and easily detach the fan from the casing.

According to the aspect of the present invention, the operation portion is arranged in the accommodation portion, and a space is formed between the side surface of the accommodation portion facing toward the operation portion, and the operation portion, and is configured to allow insertion of a fingertip of an operator therein. Consequently, the operator can easily operate the operation portion, and easily detach the fan from the casing.

According to the aspect of the present invention, the housing may include a protrusion portion formed on a surface of the housing facing toward a side surface of the accommodation portion. Consequently, it is easy to insert the fan in the accommodation portion of the casing, and easily attach the fan to the casing.

The aspect of the present invention is a fan configured to cool an electronic part accommodated in a casing, and inserted from an opening portion formed in an accommodation portion of the casing and accommodated in the accommodation portion, and the fan including: an impeller including a blade; a housing configured to rotatably support the impeller; an engagement portion formed in the housing, and configured to engage with the engaged portion formed on a side surface of the accommodation portion to restrict movement of the fan in a direction from an interior of the accommodation portion toward the opening portion; and a biasing portion formed on a surface of the housing facing toward a side surface of the accommodation portion, and configured to bias the fan in a direction apart from the side surface of the accommodation portion. According to this configuration, it is possible to suppress an increase in the number of parts and suppress rattling of the fan in the casing.

The aspect of the present invention may further include a motor configured to drive the impeller; and the housing may include a load side connector configured to connect with a supply side connector configured to supply power to the motor and arranged on an electronic substrate on which the electronic part is mounted. Thus, when the fan is accommodated in the accommodation portion, the load side connector comes to be connected with the supply side connector. Consequently, it is possible to improve efficiency of the operation of attaching the fan to the casing.

The present invention can suppress an increase in the number of parts, and suppress rattling of the fan in the casing.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 3 is a view showing an electronic substrate according to the first embodiment;

FIG. 4 is a view showing a portion of the accommodation portion of the casing according to the first embodiment, as seen from above;

FIG. 5 is a top view of the fan according to the first embodiment;

FIG. 6A is a left side view of the fan according to the first embodiment;

FIG. 6B is a right side view of the fan according to the first embodiment;

FIG. 9 is a top view of the fan according to a third embodiment;

FIG. 10A is a left side view of the fan according to the third embodiment;

FIG. 10B is a right side view of the fan according to the third embodiment;

FIG. 11A is a front view of the fan according to the third embodiment;

FIG. 11B is a rear view of the fan according to the third embodiment;

DESCRIPTION OF THE PREFERRED EMBODIMENTS

Preferred embodiments of a fan attachment structure and a fan according to the present invention will be described in detail below with reference to the accompanying drawings.

First Embodiment

[Outline of Fan]

Figure 1:
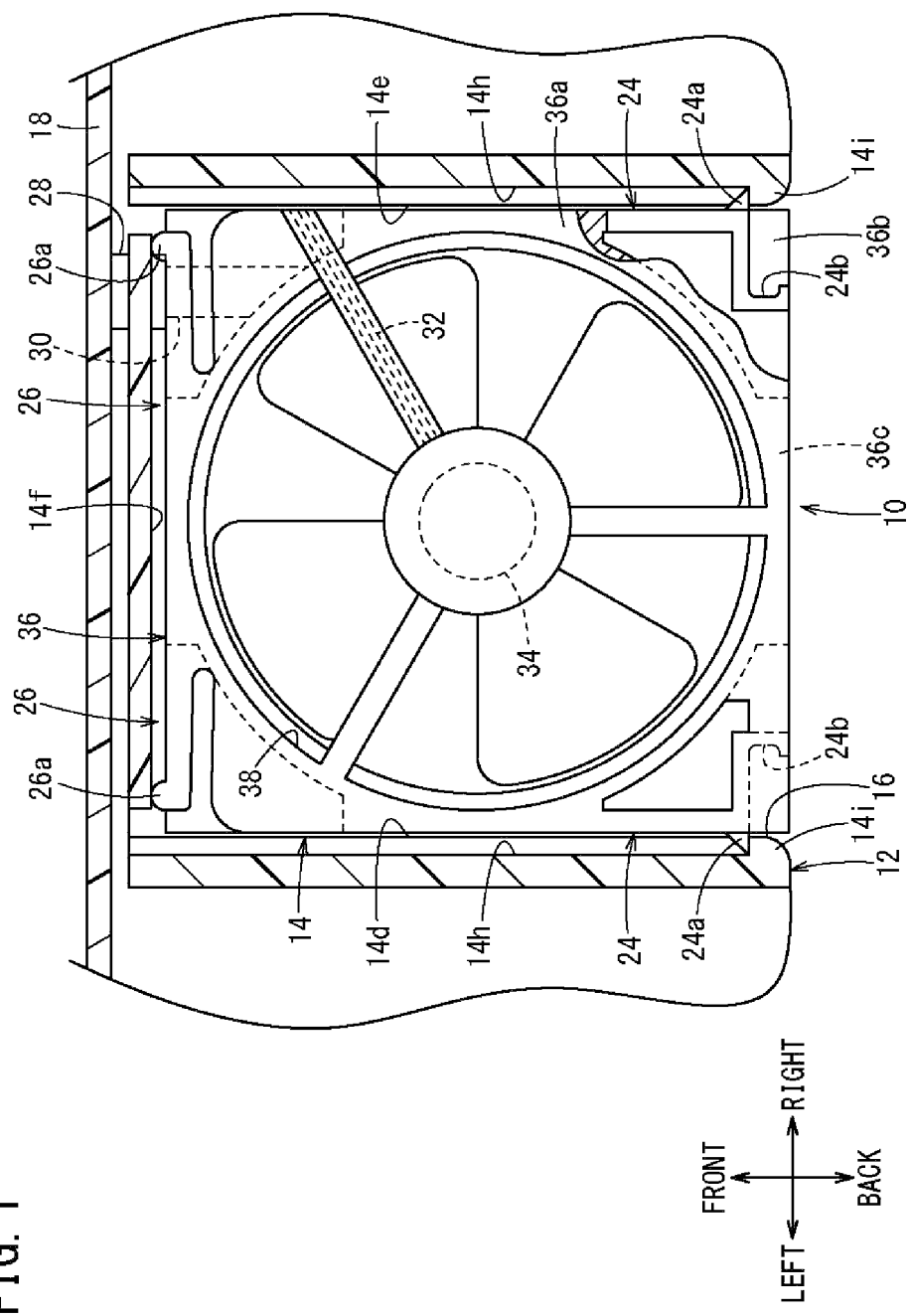
FIG. 1 is a partial cross-sectional view showing a state of a fan according to a first embodiment accommodated in an accommodation portion of a casing.
Figure 2:
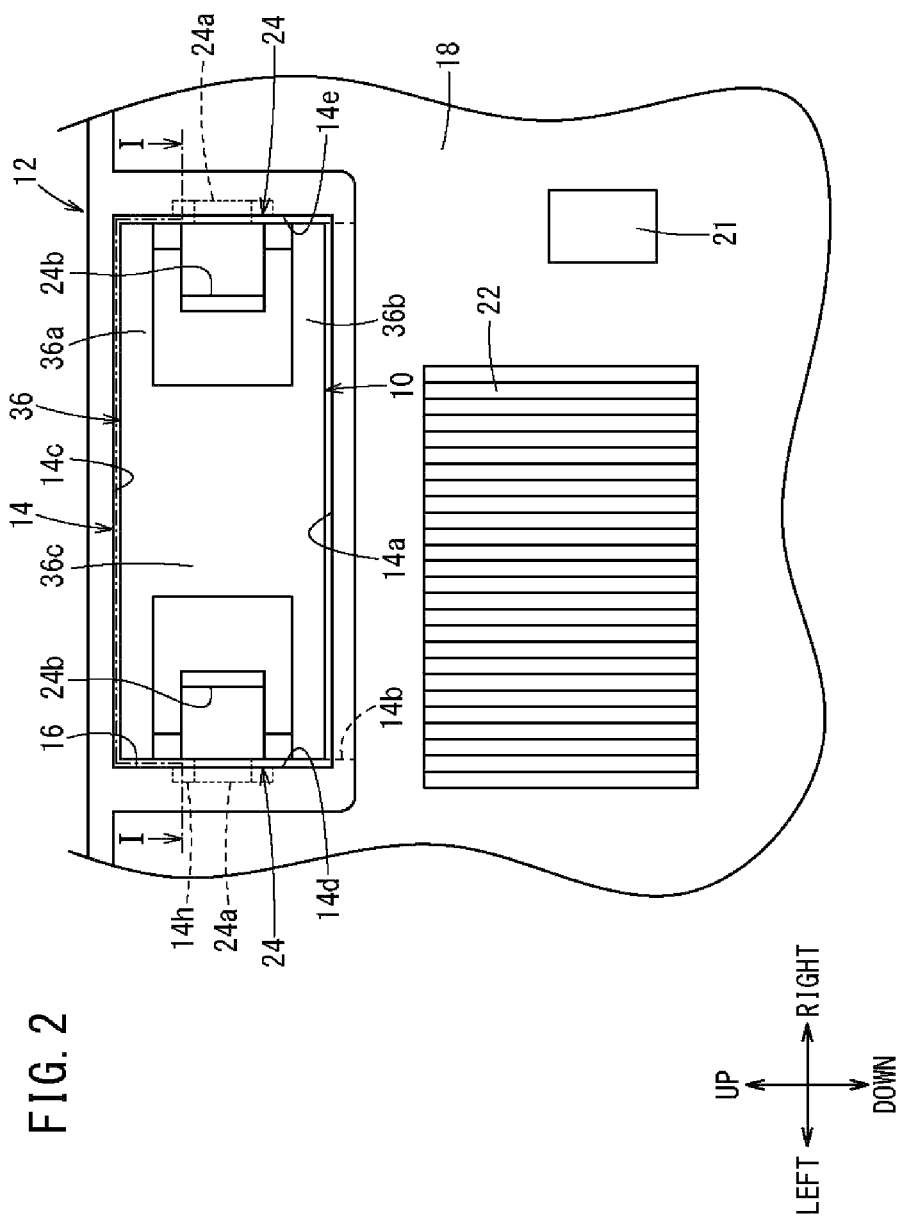
FIG. 2 is a view showing a state of the fan according to the first embodiment accommodated in the accommodation portion of the casing, as seen from a side of an opening portion of the accommodation portion.

FIG. 1 is a partial cross-sectional view showing a state of a fan 10 accommodated in an accommodation portion 14 of a casing 12. FIG. 2 is a view showing the state of the fan 10 accommodated in the accommodation portion 14 of the casing 12, as seen from a side of an opening portion 16 of the accommodation portion 14. FIG. 3 is a view showing an electronic substrate 18. In this regard, FIG. 1 is a line I-I cross-sectional view in FIG. 2.

The electronic substrate 18 is accommodated in the casing 12. Electronic parts 20, 21 are mounted on the electronic substrate 18 as shown in FIG. 3. The electronic part 20 is a part such as a processor that generates heat. A heat radiating fin 22 is installed on the electronic part 20. Heat generated by the electronic part 20 transmits to the heat radiating fin 22, and is radiated from the heat radiating fin 22. The electronic part 21 is a part that generates less heat compared to the electronic part 20, and a heat radiating fin is not arranged on the electronic part 21.

The fan 10 is inserted from the opening portion 16 formed in the accommodation portion 14, and is accommodated in the accommodation portion 14 of the casing 12. The fan 10 suctions air in the casing 12 from a vent hole 14b opened in a lower surface 14a of the accommodation portion 14, and exhausts the air to the outside. Thus, the heat in the casing 12 is exhausted to the outside and an air flow is produced in the casing 12. Consequently, it is possible to increase heat radiation efficiency of the heat radiating fin 22, encourage cooling of the electronic part 20 and encourage cooling of the electronic part 21, too.

In FIG. 2, when seen from a side of the opening portion 16, a direction in which the heat radiating fin 22 or the like is arranged is a lower side, and an opposite side is an upper side. In FIG. 1, when seen from an interior of the accommodation portion 14, a side on which the electronic substrate 18 is arranged is a front side, and a side of the opening portion 16 is a rear or back side. A left side seen in a state in FIG. 1 is a left side, and an opposite side is a right side. In this regard, a positional relationship between parts or members is not limited to upper, lower, forward, backward, left and right directions described herein.

[Configuration of Casing]

FIG. 4 is a view showing a portion of the accommodation portion 14 of the casing 12 from above. A configuration of the casing 12 will be described in detail with reference to FIGS. 1, 2 and 4.

The casing 12 is made of resin. The accommodation portion 14 formed in the casing 12 includes a space of a shape that goes substantially along an outer shape of the fan 10. The accommodation portion 14 includes an upper surface 14c, the lower surface 14a, a left surface 14d, a right surface 14e and a front surface 14f. The vent hole 14b is opened in the lower surface 14a as described above. A plurality of exhaust holes 14g are opened in the upper surface 14c. Each exhaust hole 14g is formed into a size that does not allow insertion of a fingertip of an operator. The left surface 14d and the right surface 14e include groove portions 14f linearly extending from the front surface 14f toward the opening portion 16, but just before the opening portion 16. Thus, portions protruding inwardly from the groove portions 14h are formed at end portions of the left surface 14d and the right surface 14e on a side of the opening portion 16, and form engaged portions 14i. The electronic substrate 18 is installed outside the accommodation portion 14. A through-hole is formed in a wall of the accommodation portion 14 on a side of the front surface 14f, allows insertion of a supply side connector 28 mounted on the electronic substrate 18 and is not shown. Thus, the supply side connector 28 is exposed in the accommodation portion 14.

[Configuration of Fan]

The fan 10 includes lock mechanisms 24 that prevent the fan 10 from dropping from the accommodation portion 14, rattling suppressing mechanisms (biasing portions) 26 that suppress rattling of the fan 10 in the accommodation portion 14, and a load side connector 30 that is connected to the supply side connector 28.

When engagement portions 24a formed in the lock mechanisms 24 engage with the engaged portions 14i formed on the left surface 14d and the right surface 14e of the accommodation portion 14, the lock mechanisms 24 restrict movement of the fan 10 in a direction from the accommodation portion 14 toward the opening portion 16. The rattling suppressing mechanisms 26 bias the fan 10 backward (a direction apart from the front surface 14f of the accommodation portion 14) to suppress rattling of the fan 10 in the accommodation portion 14. The load side connector 30 is connected with a motor 34 that is a drive source of the fan 10 via a wire 32, and is connected with the supply side connector 28 to supply power to the motor 34. The lock mechanisms 24, the rattling suppressing mechanisms 26 and the load side connector 30 are arranged in a housing 36 of the fan 10.

Figure 7A:
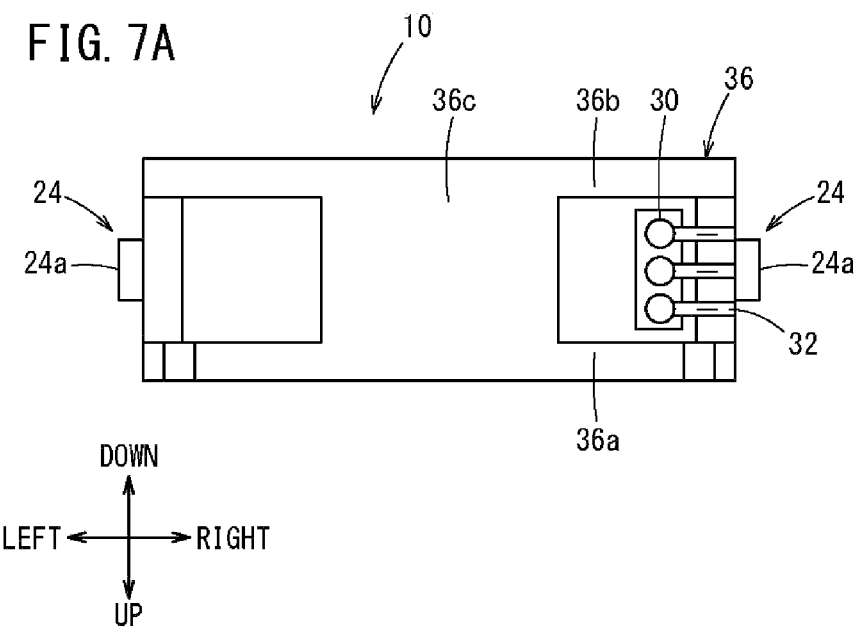
FIG. 7A is a front view of the fan according to the first embodiment.
Figure 7B:
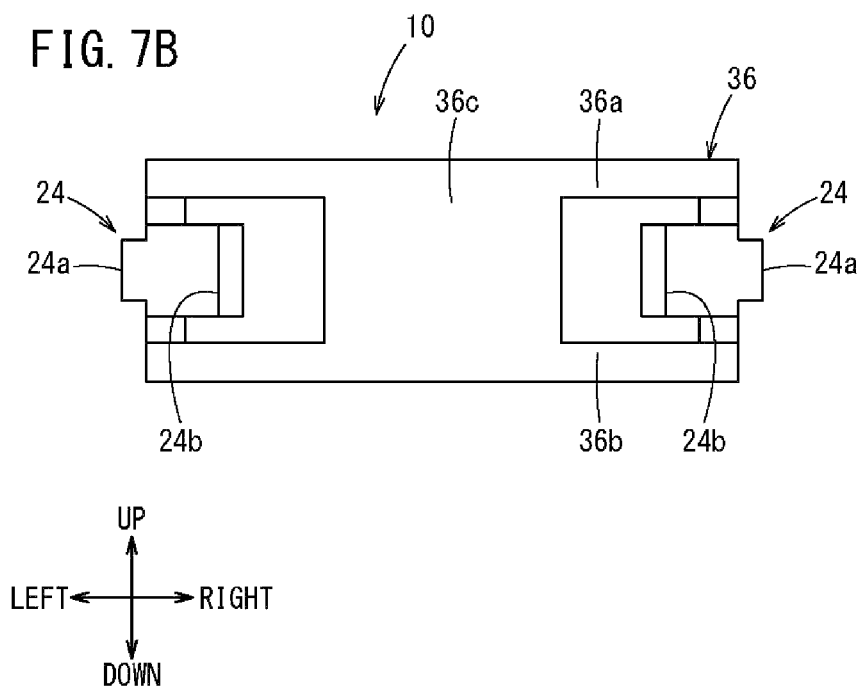
FIG. 7B is a rear view of the fan according to the first embodiment.

Each component formed in the housing 36 of the fan 10 will be described in detail below. FIG. 5 is a top view of the fan 10. FIG. 6A is a left side view of the fan 10. FIG. 6B is a right side view of the fan 10. FIG. 7A is a front view of the fan 10. FIG. 7B is a rear view of the fan 10.

The housing 36 of the fan 10 is made of resin. An outer shape of the housing 36 is formed in a substantially cuboid shape. The housing 36 includes an upper flange 36a on an upper side, and a lower flange 36b on a lower side. The housing 36 includes a main body portion 36c between the upper flange 36a and the lower flange 36b. A cylindrical portion 38 is formed in the housing 36, and includes a through-hole that penetrates the upper flange 36a, the lower flange 36b and the main body portion 36c in upper and lower directions. The motor 34 is accommodated in the cylindrical portion 38. An impeller 40 is fixed to a drive shaft of the motor 34, and includes a plurality of blades 40a. The impeller 40 is driven to rotate by the motor 34.

The lock mechanisms 24 are arranged in the housing 36 and extend from a left surface and a right surface of the main body portion 36c toward a rear side. The lock mechanisms 24 are molded integrally with the housing 36 by using the same resin as that of the housing 36. The lock mechanisms 24 are formed to be elastically deformable toward an inside of the housing 36. The engagement portions 24a are formed in the lock mechanisms 24. The engagement portions 24a are formed protruding outwardly in left and right directions of the housing 36 in a state where the lock mechanisms 24 are not elastically deformed. Front side surfaces of the engagement portions 24a are formed to widen from the front side toward the rear side outwardly in the left and right directions of the housing 36. Thus, when the fan 10 is inserted from the opening portion 16 of the accommodation portion 14, the engaged portions 14i of the accommodation portion 14 press the engagement portions 24a in an inner direction of the housing 36, and elastically deform the lock mechanisms 24 in the inner direction of the housing 36. When the engagement portions 24a pass the engaged portions 14i, shapes of the lock mechanisms 24 are restored, and the engagement portions 24a and the engaged portions 14i engage with each other.

An operation portion 24b is formed in the lock mechanism 24. The operation portion 24b is operated by the operator to take the fan 10 out of the accommodation portion 14. When a fingertip of the operator applies a force to the operation portions 24b in the inner direction of the housing 36, the entire lock mechanisms 24 elastically deform, and the engagement portions 24a and the engaged portions 14i are disengaged. In a state where the fan 10 is accommodated in the accommodation portion 14, the operator can directly touch the operation portions 24b through the opening portion 16 (see FIGS. 1 and 2). The operation portions 24b are formed further inside compared to the left surface and the right surface of the main body portion 36c. Thus, the space is secured between the left surface 14d and the right surface 14e of the accommodation portion 14, and the operation portions 24b, and allows insertion of the fingertip of the operator therein.

The rattling suppressing mechanisms 26 are arranged on the upper flange 36a of the housing 36. The rattling suppressing mechanisms 26 are arranged on the left and the right, one by one, at a front end portion of the upper flange 36a. The rattling suppressing mechanisms 26 are molded integrally with the housing 36 by using the same resin as that of the housing 36. The rattling suppressing mechanisms 26 are formed to be elastically deformable toward the inside of the housing 36. A contact portion 26a is formed in the rattling suppressing mechanism 26. The contact portion 26a is formed protruding outwardly in a forward direction of the housing 36 in a state where the rattling suppressing mechanism 26 is not elastically deformed. In the state where the fan 10 is accommodated in the accommodation portion 14, the contact portions 26a come into contact with the front surface 14f. In this case, the rattling suppressing mechanisms 26 bias the entire fan 10 in a direction to move from an interior of the accommodation portion 14 toward the opening portion 16. Consequently, it is possible to maintain a contact state of the engagement portions 24a of the lock mechanisms 24 and the engaged portions 14i of the accommodation portion 14, and consequently suppress rattling of the fan 10 in the forward and backward directions in particular. When the contact portions 26a of the rattling suppressing mechanisms 26 and the front surface 14f of the accommodation portion 14 come into contact with each other, and the engagement portions 24a of the lock mechanisms 24 and the engaged portions 14i of the accommodation portion 14 come into contact with each other, friction forces are produced between the members. Consequently, it is possible to suppress rattling of the fan 10 in the upper and lower directions and the left and right directions, too.

The load side connector 30 is arranged in the housing 36. The load side connector 30 is molded in the housing 36, and is integrally formed with the housing 36. The load side connector 30 is formed protruding forward from the housing 36. When the fan 10 is attached to the casing 12, the load side connector 30 is connected with the supply side connector 28 exposed in the accommodation portion 14. The supply side connector 28 and the load side connector 30 according to the first embodiment are insertion types that the supply side connector 28 is a female type (or a male type) and the load side connector 30 is the male type (or the female type). However, the supply side connector 28 and the load side connector 30 may not be the insertion types, and instead a terminal of the exposed supply side connector 28 and a terminal of the load side connector 30 may come into contact with each other.

[Function and Effect]

Methods for attaching the fan 10 to the casing 12 may include attachment of the fan 10 by screws or by an adaptor. However, these methods have problems of an increase in man-hours and the number of parts, and an increase in an accommodation area.

Hence, in the first embodiment, the housing 36 of the fan 10 include the lock mechanisms 24 (engagement portions 24a) and the rattling suppressing mechanisms 26. More specifically, the engagement portions 24a of the lock mechanisms 24 and the engaged portions 14i of the accommodation portion 14 are engaged to prevent the fan 10 from dropping from the accommodation portion 14. The rattling suppressing mechanisms 26 bias the fan 10 in the direction apart from the front surface 14f of the accommodation portion 14. Consequently, it is possible to easily attach the fan 10 to the casing 12, prevent the fan 10 from rattling in the accommodation portion 14, suppress the number of parts of components for attaching the fan 10 to the casing 12, and suppress the accommodation area.

In the first embodiment, the load side connector 30 is arranged in the housing 36 and is connected to the supply side connector 28 of the electronic substrate 18. Consequently, when the fan 10 is attached to the casing 12, it is possible to simultaneously connect the supply side connector 28 and the load side connector 30.

In the first embodiment, the rattling suppressing mechanisms 26 bias the fan 10 in the direction to move from the interior of the accommodation portion 14 toward the opening portion 16. Consequently, it is possible to maintain the contact state of the engagement portions 24a of the lock mechanisms 24 and the engaged portions 14i of the accommodation portion 14, and consequently suppress rattling of the fan 10 in the accommodation portion 14.

According to the first embodiment, the operation portions 24b are formed and operated by the operator to disengage the engagement portions 24a of the lock mechanisms 24 and the engaged portions 14i of the accommodation portion 14. Consequently, it is possible to easily detach the fan 10 from the casing 12.

According to the first embodiment, the space is provided between the operation portions 24b, and the left surface 14d and the right surface 14e of the accommodation portion 14, for allowing insertion of the fingertip of the operator. Consequently, the operator can easily operate the operation portions 24b, and perform an operation of easily detaching the fan 10 from the casing 12.

Second Embodiment

In the second embodiment, the shapes of the operation portions 24b are different from those of the first embodiment. The second embodiment will be described below. The components having the same functions as those in the first embodiment will be assigned the same reference numerals and described.

Figure 8:
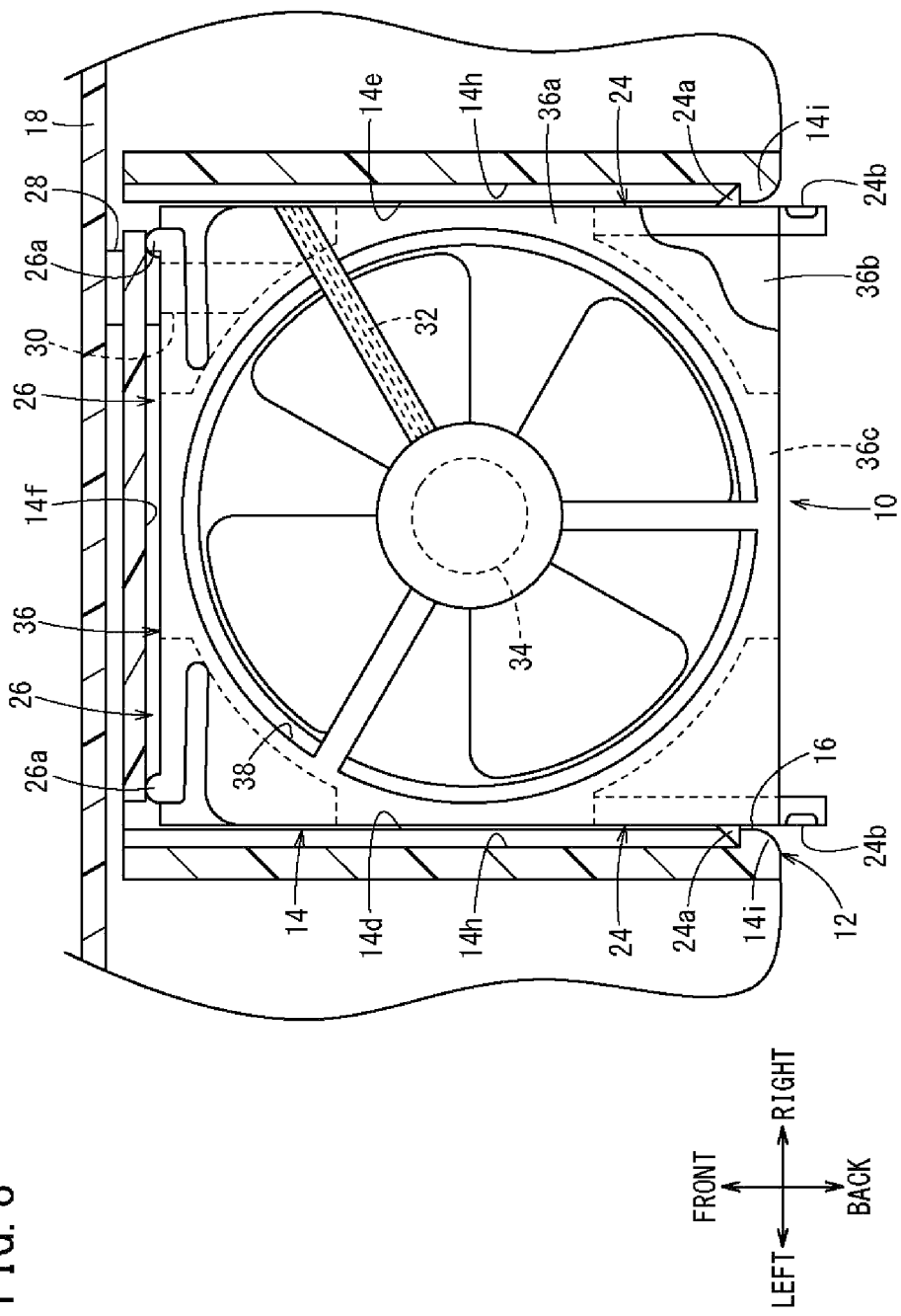
FIG. 8 is a partial cross-sectional view showing a state of the fan according to a second embodiment accommodated in the accommodation portion of the casing.

FIG. 8 is a partial cross-sectional view showing a state of the fan 10 accommodated in the accommodation portion 14 of the casing 12. The operation portions 24b are formed extending outwardly from the opening portion 16 of the accommodation portion 14. Consequently, there is no obstacle around the operation portions 24b, so that the operator can easily operate the operation portions 24b and can perform an operation of easily detaching the fan 10 from the casing 12.

Third Embodiment

The third embodiment will be described below. Components having the same functions as those in the first embodiment and the second embodiment will be assigned the same reference numerals and described.

Figure 12:
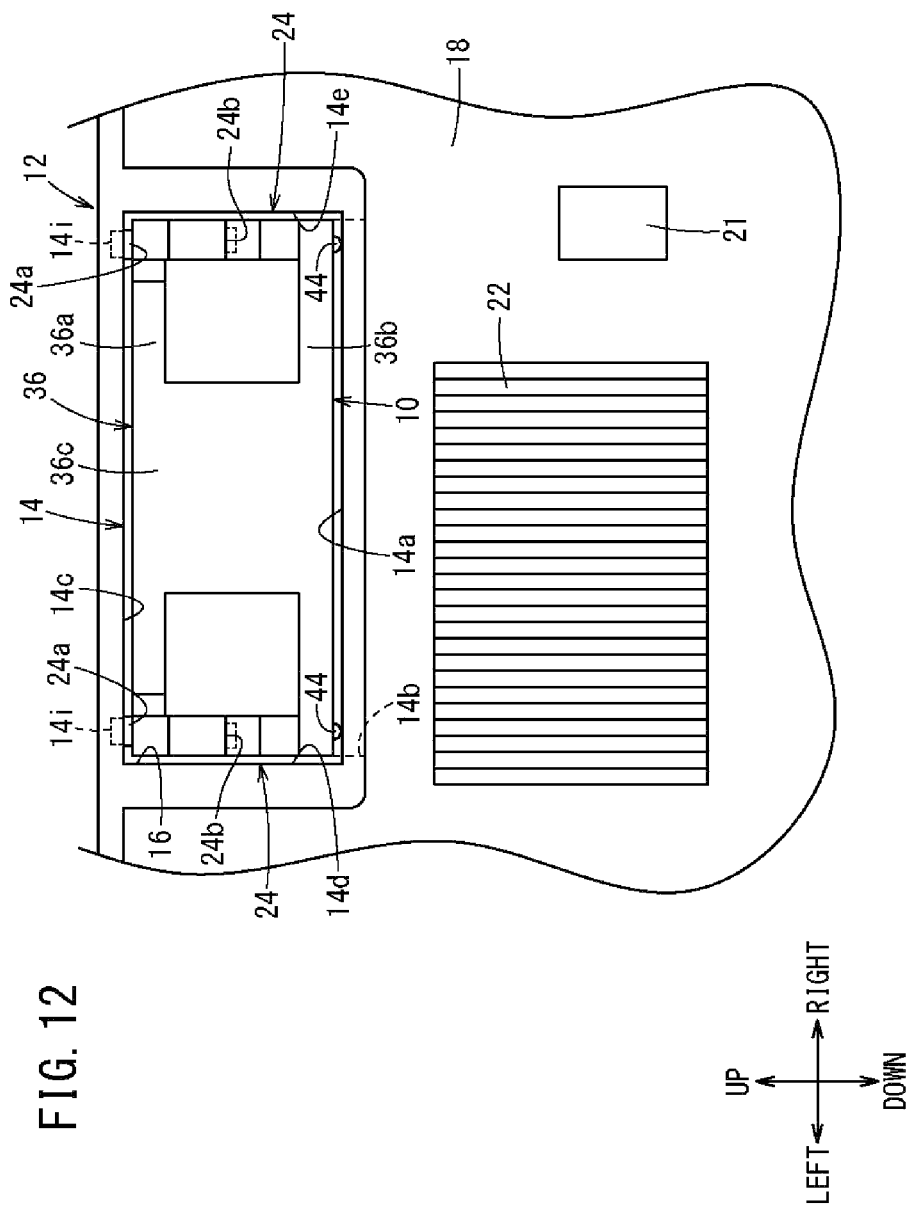
FIG. 12 is a view showing a state of the fan according to the third embodiment accommodated in the accommodation portion of the casing, as seen from the side of the opening portion of the accommodation portion.

FIG. 9 is a top view of the fan 10. FIG. 10A is a left side view of the fan 10. FIG. 10B is a right side view of the fan 10. FIG. 11A is a front view of the fan 10. FIG. 11B is a rear view of the fan 10. FIG. 12 is a view showing a state of the fan 10 accommodated in the accommodation portion 14 of the casing 12, as seen from a side of the opening portion 16 of the accommodation portion 14.

The lock mechanisms 24 are arranged on the upper flange 36a of the housing 36. The lock mechanisms 24 are arranged on the left and the right, one by one, at the rear end portion of the upper flange 36a. The lock mechanisms 24 are formed to be elastically deformable toward the inside of the housing 36. The engagement portion 24a is formed on each lock mechanism 24. The engagement portion 24a is formed protruding outwardly in an upper direction of the housing 36 in a state where the lock mechanism 24 does not elastically deform. When the engagement portions 24a engage with the engaged portions 14i formed inside the upper surface 14c of the accommodation portion 14, the lock mechanisms 24 restrict movement of the fan 10 in the direction from an interior of the accommodation portion 14 toward the opening portion 16. The front side surface of the engagement portion 24a is formed to widen (or heighten) from the front side toward the rear side outwardly in the upper and lower directions of the housing 36. Thus, when the fan 10 is inserted from the opening portion 16 of the accommodation portion 14, the engaged portions 14i press the engagement portions 24a in the inner direction of the housing 36, and elastically deform the lock mechanisms 24 in the inner direction of the housing 36. When the engagement portions 24a pass the engaged portions 14i, shapes of the lock mechanisms 24 are restored, and the engagement portions 24a and the engaged portions 14i engage with each other.

An operation portion 24b is formed in the lock mechanism 24. The operation portion 24b is formed further inside compared to a surface of the upper flange 36a. Thus, the space is secured between the upper flange 36a and the operation portions 24b, for allowing insertion of the fingertip of the operator.

The rattling suppressing mechanisms 26 are arranged in the housing 36, and extend from the front surface of the main body portion 36c in a left direction. The rattling suppressing mechanisms 26 are molded integrally with the housing 36 by using the same resin as that of the housing 36. The rattling suppressing mechanisms 26 are formed to be elastically deformable toward the inside of the housing 36. The contact portion 26a is formed in the rattling suppressing mechanism 26. The contact portion 26a is formed protruding outwardly in the forward direction of the housing 36 in a state where the rattling suppressing mechanism 26 is not elastically deformed. In the state where the fan 10 is accommodated in the accommodation portion 14, the contact portions 26a come into contact with the front surface 14f, and the rattling suppressing mechanisms 26 elastically deform in the inner direction of the housing 36. The rattling suppressing mechanisms 26 bias the entire fan 10 backward (in the direction from the interior of the accommodation portion 14 toward the opening portion 16). Consequently, it is possible to maintain a contact state of the engagement portions 24a of the lock mechanisms 24 and the engaged portions 14i of the accommodation portion 14, and consequently suppress rattling of the fan 10 in the forward and backward directions in particular. When the contact portions 26a of the rattling suppressing mechanisms 26 and the front surface 14f of the accommodation portion 14 come into contact with each other, and the engagement portions 24a of the lock mechanisms 24 and the engaged portions 14i of the accommodation portion 14 come into contact with each other, friction forces are produced between the members. Consequently, it is possible to suppress rattling of the fan 10 in the upper and lower directions and the left and right directions, too.

Protrusion portions 42 are formed on a front side of the upper flange 36a of the housing 36, and protrude outwardly from a surface of the upper flange 36a. The protrusion portions 42 are formed on the left and the right, one by one. Protrusion portions 44 are formed on a front side of the lower flange 36b of the housing 36, and protrude outwardly from a surface of the lower flange 36b. The protrusion portions 44 are formed on the left and the right, one by one.

[Function and Effect]

In the third embodiment, the protrusion portions 42 are formed on the upper flange 36a facing toward the upper surface 14c of the accommodation portion 14. Further, the protrusion portions 44 are formed on the lower flange 36b facing toward the lower surface 14a of the accommodation portion 14. Consequently, when the fan 10 is inserted in the accommodation portion 14, it is possible to insert the fan 10 in the accommodation portion 14 in a state where the protrusion portions 44 are placed in contact with the lower surface 14a of the accommodation portion 14 or the state where the protrusion portions 42 are placed in contact with the upper surface 14c of the accommodation portion 14. Compared to a case where the protrusion portions 42, 44 are not formed, it is possible to make a contact area of the housing 36 and the accommodation portion 14 small, and easily insert the fan 10 in the accommodation portion 14.

Other Embodiments

The present invention has been described above based on the first embodiment to the third embodiment. However, a specific configuration is not limited to the first embodiment to the third embodiment, and the present invention includes design changes or the like made without departing from the gist of the present invention.

Another Embodiment 1

Figure 13:
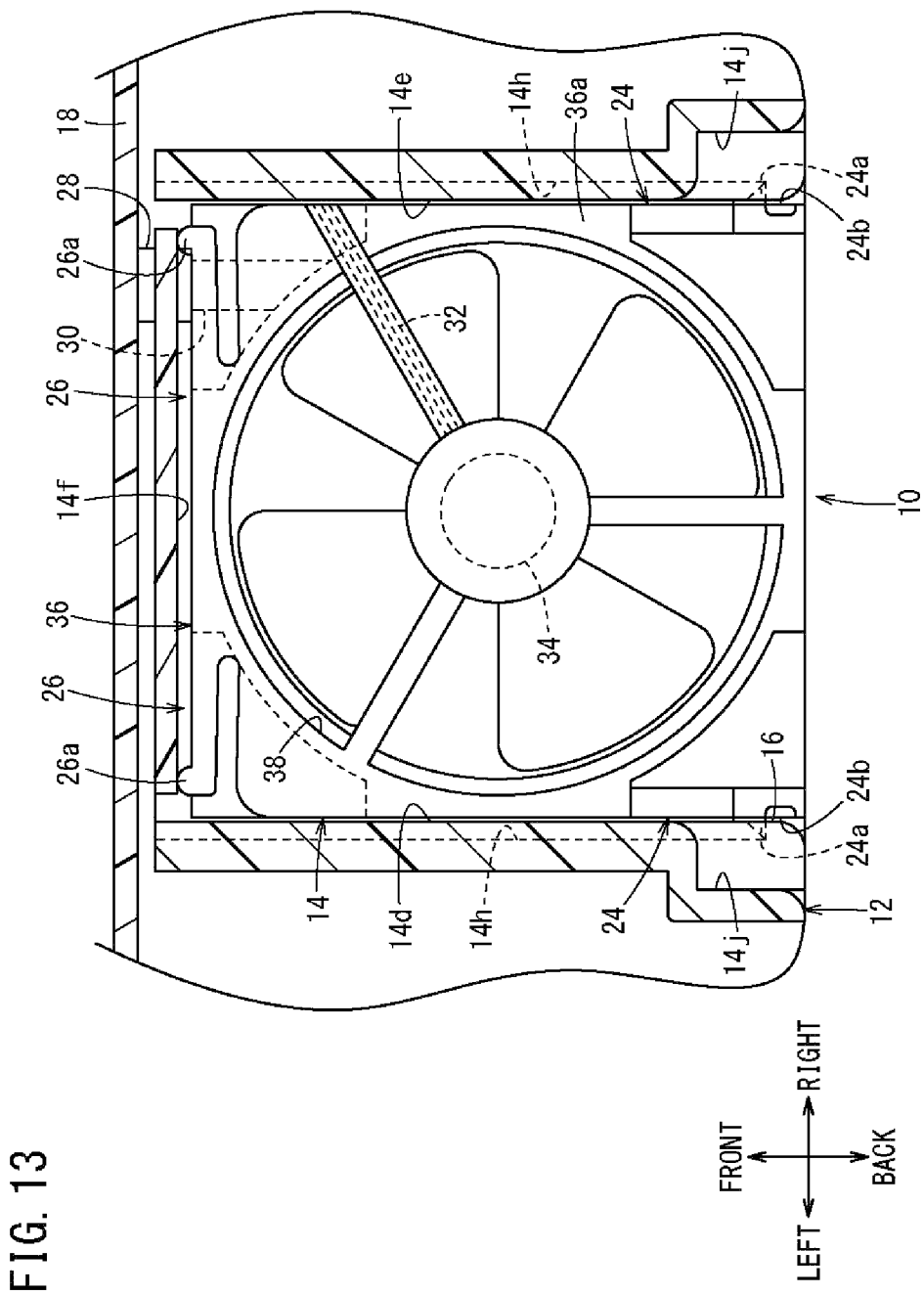
FIG. 13 is a partial cross-sectional view showing a state of the fan according to another embodiment 1 accommodated in the accommodation portion of the casing.
Figure 14:
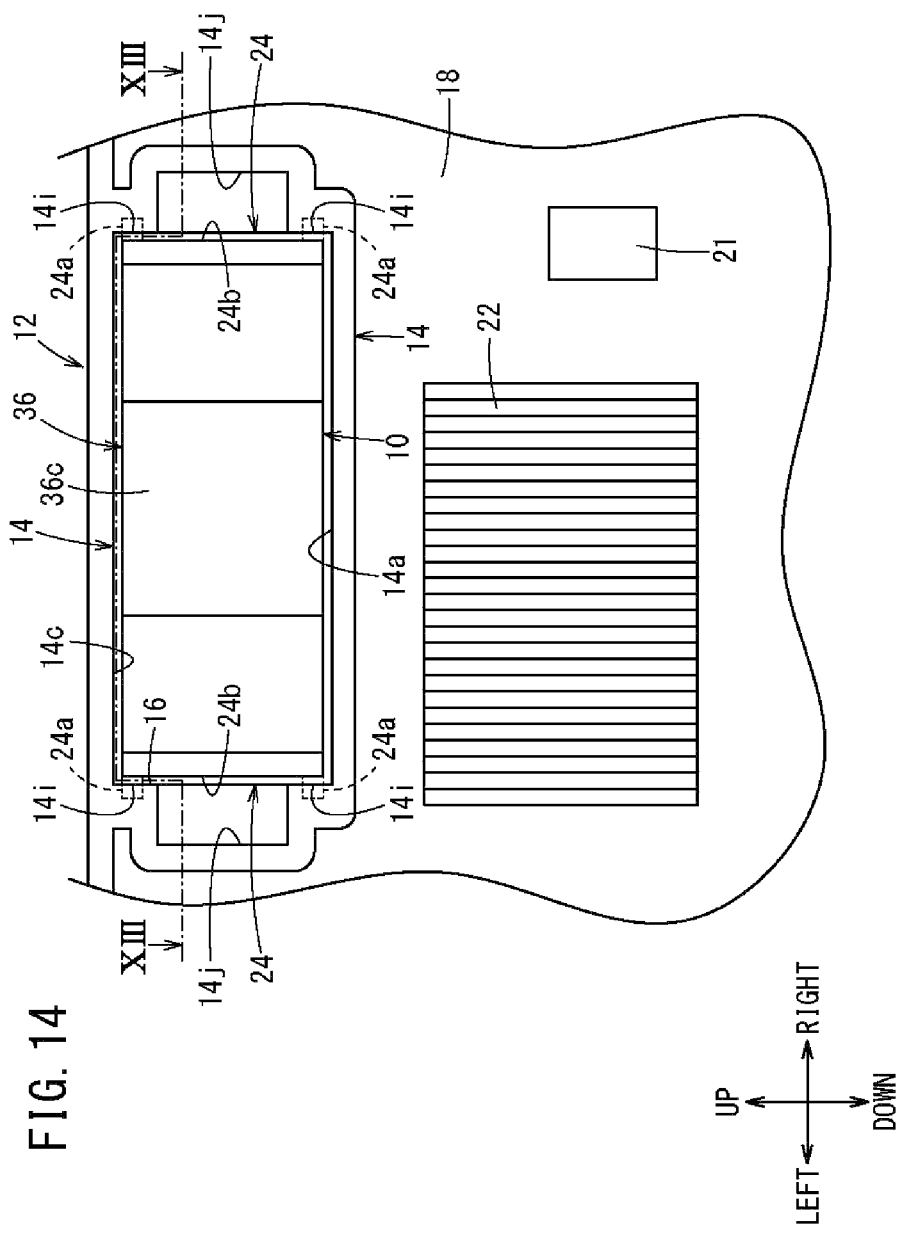
FIG. 14 is a view showing the state of the fan according to the other embodiment 1 accommodated in the accommodation portion of the casing, as seen from the side of the opening portion of the accommodation portion.

FIG. 13 is a partial cross-sectional view showing a state of the fan 10 accommodated in the accommodation portion 14 of the casing 12. FIG. 14 is a view showing the state of the fan 10 accommodated in the accommodation portion 14 of the casing 12, as seen from a side of the opening portion 16 of the accommodation portion 14. FIG. 13 is a line XIII-XIII cross-sectional view in FIG. 14.

In the first embodiment, the operation portions 24b of the lock mechanisms 24 are formed further inside compared to the left surface and the right surface of the main body portion 36c. Thus, the space is secured between the operation portion 24b, and the left surface 14d and the right surface 14e of the accommodation portion 14, for allowing insertion of the fingertip of the operator. A following configuration may be employed instead of this configuration.

As shown in FIGS. 13 and 14, portions facing toward the operation portions 24b are formed on the left surface 14d and the right surface 14e of the accommodation portion 14, and protrude toward an outside of the accommodation portion 14, and insertion holes 14j are formed. The operation portions 24b are formed extending from the left surface and the right surface of the main body portion 36c backward. The operation portions 24b are disposed inside the accommodation portion 14.

The engaged portions 14i are formed on the upper side and the lower side of the insertion holes 14j, one by one. The engagement portions 24a are formed at both width direction end portions of the lock mechanisms 24, one by one. Consequently, it is possible to secure the depths of the insertion holes 14j, and the operator can insert the fingertip in the insertion holes 14j and operate the operation portions 24b.

Another Embodiment 2

Figure 15:
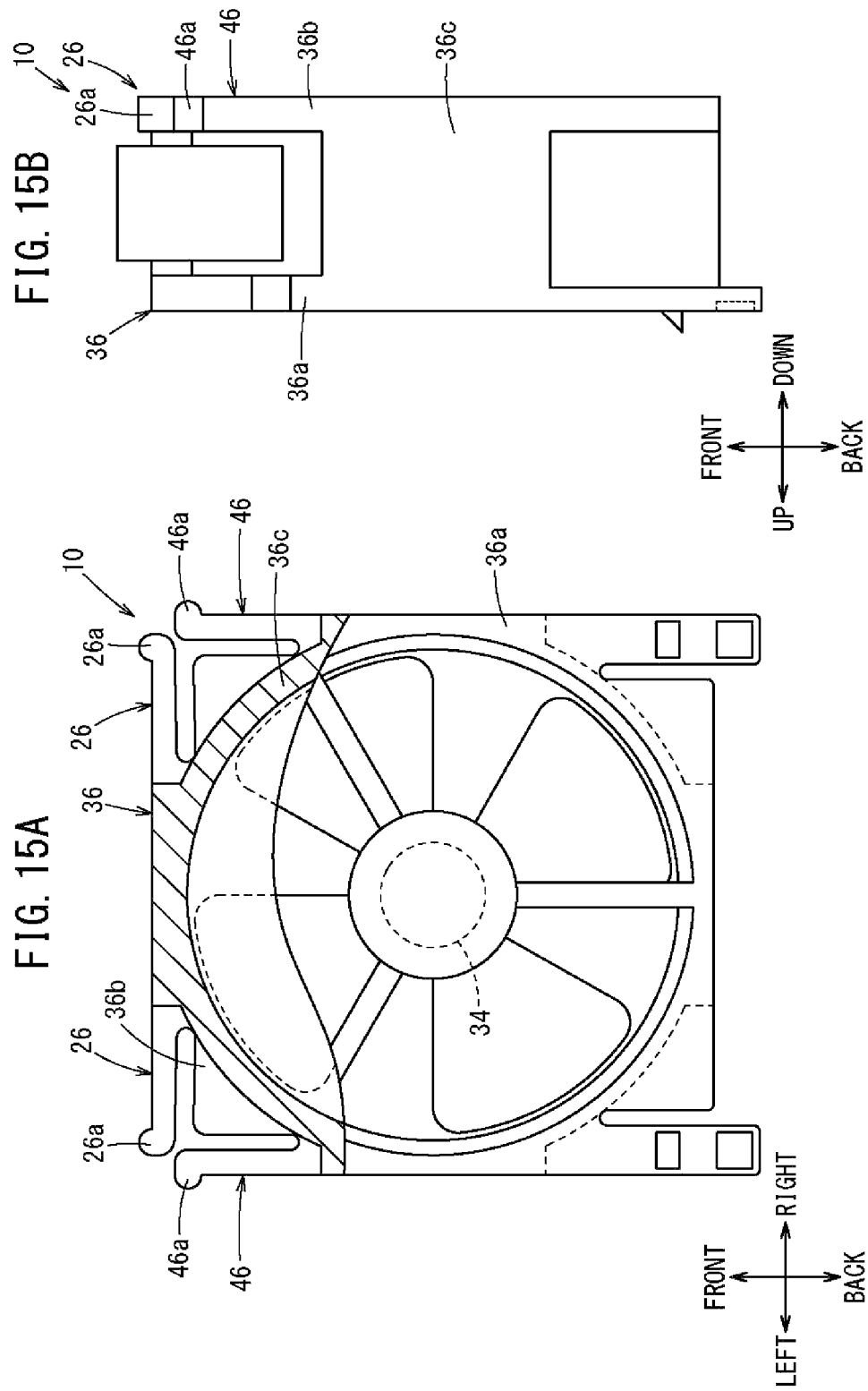
FIG. 15A is a top view of the fan according to another embodiment 2.
FIG. 15B is a right side view of the fan according to the other embodiment 2.

FIG. 15A is a top view of the fan 10, and shows part of the fan 10 as a cross-sectional view. FIG. 15B is a right side view of the fan 10.

In the first embodiment, the rattling suppressing mechanisms 26 are arranged on the upper flange 36a. Instead of this configuration, the rattling suppressing mechanisms 26 may be arranged on the lower flange 36b.

In the first embodiment, the rattling suppressing mechanisms 26 are formed such that the contact portions 26a come into contact with the front surface 14f of the accommodation portion 14. In addition to this configuration, other rattling suppressing mechanisms 46 may be arranged. The rattling suppressing mechanisms 46 are formed such that contact portions 46a come into contact with the left surface 14d and the right surface 14e of the accommodation portion 14, respectively.

In the second embodiment, the lock mechanisms 24 are arranged on the main body portion 36c. Instead of this configuration, the lock mechanisms 24 may be formed on the upper flange 36a. In this case, the contact portions 26a are formed protruding outwardly in the forward direction of the housing 36 in the state where the rattling suppressing mechanisms 26 are not elastically deformed. When the engagement portions 24a engage with the engaged portions 14i formed inside the upper surface 14c of the accommodation portion 14, the lock mechanisms 24 restrict movement of the fan 10 in the direction from the interior of the accommodation portion 14 toward the opening portion 16.

Another Embodiment 3

Figure 16:
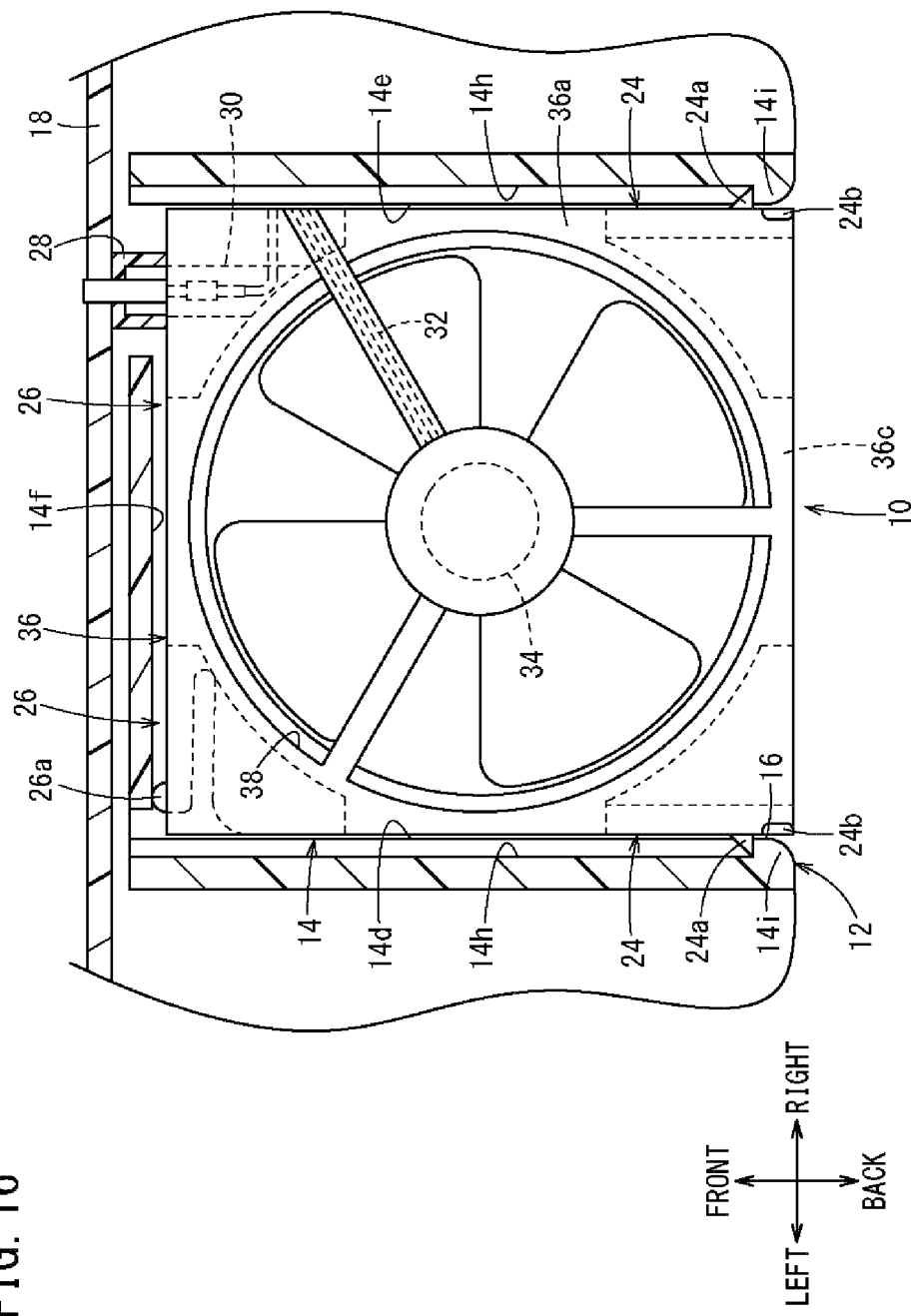
FIG. 16 is a partial cross-sectional view showing the state of the fan according to another embodiment 3 accommodated in the accommodation portion of the casing.

FIG. 16 is a partial cross-sectional view showing the state of the fan 10 accommodated in the accommodation portion 14 of the casing 12. In the second embodiment, the operation portions 24b are formed extending outwardly from the opening portion 16 of the accommodation portion 14. Instead of this configuration, the operation portions 24b may be formed inside the accommodation portion 14. The fan 10 is hardly detached from the casing 12, and it is possible to easily detach the fan 10 from the casing 12 by using a tool. By arranging the operation portions 24b in the accommodation portion 14, the operator cannot easily detach the fan 10 from the casing 12. Consequently, it is possible to prevent the operator from detaching the fan 10 by mistake.

What is claimed is:

1. An attachment structure of a fan for attaching to a casing the fan configured to cool an electronic part accommodated in the casing, wherein the casing includes:
an accommodation portion including an opening portion in which the fan is inserted, and being configured to accommodate the fan; and
an engaged portion formed on a side surface of the accommodation portion, and
wherein the fan includes:
an impeller including a blade;
a housing configured to rotatably support the impeller;
an engagement portion formed in the housing and configured to engage with the engaged portion to restrict movement of the fan in a direction from an interior of the accommodation portion toward the opening portion; and
a biasing portion having a pair of elastically deformable contact portions that are part of the housing facing toward a side surface of the accommodation portion of the casing, and configured to exert a force on the accommodation portion of the casing to move the fan in a direction towards the opening portion of the accommodation portion.

2. The attachment structure of the fan according to claim 1, wherein:
the fan includes a motor configured to drive the impeller;
the casing accommodates an electronic substrate on which the electronic part is mounted;
a supply side connector configured to supply power to the motor is mounted on the electronic substrate; and
the housing includes a load side connector configured to connect with the supply side connector.

3. The attachment structure of the fan according to claim 1, wherein the biasing portion is configured to bias the fan in a direction to move from the interior of the accommodation portion toward the opening portion.

4. The attachment structure of the fan according to claim 1, further comprising an operation portion formed in the housing and configured to disengage the engaged portion and the engagement portion.

5. The attachment structure of the fan according to claim 4, wherein the operation portion is formed extending outwardly from the opening portion of the accommodation portion.

6. The attachment structure of the fan according to claim 4, wherein:
the operation portion is arranged in the accommodation portion, and
a space is formed between the side surface of the accommodation portion facing toward the operation portion, and the operation portion, and is configured to allow insertion of a fingertip of an operator therein.

7. The attachment structure of the fan according to claim 1, wherein the housing includes a protrusion portion formed on a surface of the housing facing toward a side surface of the accommodation portion.

8. A fan for cooling an electronic part accommodated in a casing, and the fan inserted from an opening portion formed in an accommodation portion of the casing and accommodated in the accommodation portion, the fan comprising:
an impeller including a blade;
a housing configured to rotatably support the impeller;
an engagement portion formed in the housing, and configured to engage with the engaged portion formed on a side surface of the accommodation portion to restrict movement of the fan in a direction from an interior of the accommodation portion toward the opening portion; and
a biasing portion having a pair of elastically deformable contact portions that are part of the housing facing toward a side surface of the accommodation portion of the casing, and configured to exert a force on the accommodation portion of the casing to move the fan in a direction towards the opening portion of the accommodation portion.

9. The fan according to claim 8, further comprising a motor configured to drive the impeller,
wherein the housing includes a load side connector configured to connect with a supply side connector configured to supply power to the motor and arranged on an electronic substrate on which the electronic part is mounted.

* * * * *